(12) United States Patent
Rutten et al.

(10) Patent No.: US 12,346,032 B2
(45) Date of Patent: Jul. 1, 2025

(54) SYSTEM, LITHOGRAPHIC APPARATUS AND METHOD

(71) Applicant: ASML NETHERLANDS B.V., Veldhoven (NL)

(72) Inventors: Rob Johan Theodoor Rutten, Heeze (NL); Ruud Hendrikus Martinus Johannes Bloks, Helmond (NL); Alexandrios Mathew, San Diego, CA (US); Ron Vennix, Bladel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 75 days.

(21) Appl. No.: 17/914,903

(22) PCT Filed: Apr. 1, 2021

(86) PCT No.: PCT/EP2021/058680
§ 371 (c)(1),
(2) Date: Sep. 27, 2022

(87) PCT Pub. No.: WO2021/213791
PCT Pub. Date: Oct. 28, 2021

(65) Prior Publication Data
US 2023/0333487 A1 Oct. 19, 2023

Related U.S. Application Data

(60) Provisional application No. 63/013,170, filed on Apr. 21, 2020.

(30) Foreign Application Priority Data

Apr. 20, 2020 (NL) ...................................... 2025372

(51) Int. Cl.
*G03F 7/20* (2006.01)
*G03F 7/00* (2006.01)

(52) U.S. Cl.
CPC .. *G03F 7/706835* (2023.05); *G03F 7/706843* (2023.05); *G03F 7/7085* (2013.01); *G03F 7/70858* (2013.01); *G03F 7/70933* (2013.01)

(58) Field of Classification Search
CPC ......... G03F 7/706835; G03F 7/706843; G03F 7/7085; G03F 7/70858; G03F 7/70933
See application file for complete search history.

(56) References Cited

U.S. PATENT DOCUMENTS

| 5,801,832 A | 9/1998 | Van Den Brink |
| 6,952,253 B2 | 10/2005 | Lof et al. |

(Continued)

FOREIGN PATENT DOCUMENTS

| EP | 1637930 | 3/2006 |
| JP | H05-6850 | 1/1993 |

(Continued)

OTHER PUBLICATIONS

International Search Report and Written Opinion issued in corresponding PCT Patent Application No. PCT/EP2021/058680, dated Jul. 14, 2021.

(Continued)

*Primary Examiner* — Mesfin T Asfaw
(74) *Attorney, Agent, or Firm* — Pillsbury Winthrop Shaw Pittman, LLP

(57) ABSTRACT

A system for measuring a beam. The system includes a measurement device configured to measure the beam and determine a signal based on the measured beam, and a fluid supply device configured to provide fluid as a fluid stream to, or surrounding, the beam. The system is configured to calculate noise of the signal, and to adjust a parameter of the fluid of the fluid stream to reduce the calculated noise.

20 Claims, 9 Drawing Sheets

(56) References Cited

U.S. PATENT DOCUMENTS

| | | |
|---|---|---|
| 7,602,489 B2 | 10/2009 | Van Der Pasch et al. |
| 7,982,849 B2 * | 7/2011 | Emoto ................ G03F 7/70858 355/72 |
| 10,495,985 B2 | 12/2019 | Nakiboglu |
| 2006/0256346 A1 | 11/2006 | Hill |
| 2008/0144042 A1 | 6/2008 | Tanaka |
| 2008/0198369 A1 | 8/2008 | Sogard |
| 2009/0233234 A1 | 9/2009 | Shibazaki |
| 2018/0113389 A1 | 4/2018 | Kroes et al. |
| 2019/0377270 A1 | 12/2019 | Kanehara |

FOREIGN PATENT DOCUMENTS

| | | |
|---|---|---|
| JP | 2017537340 | 12/2017 |
| WO | 2009014252 | 1/2009 |
| WO | 2013073538 | 5/2013 |
| WO | 2016074876 | 5/2016 |

OTHER PUBLICATIONS

Notice of Reasons for Refusal dated Nov. 26, 2024, issued in corresponding Japanese Patent Application No. 2022-563419 w/English translation (13 pgs.).

* cited by examiner

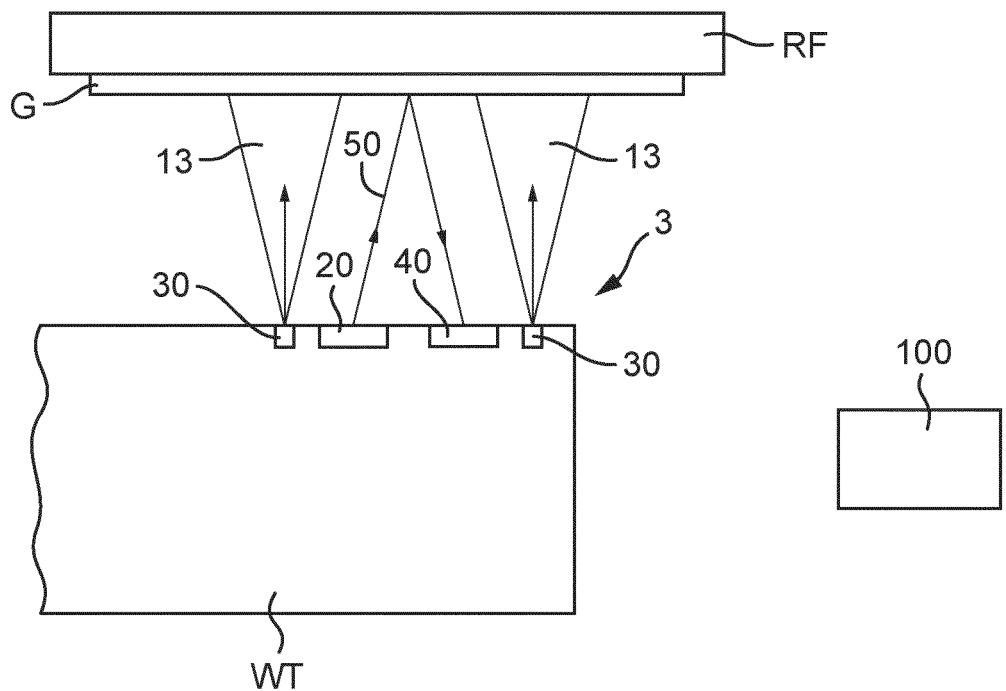
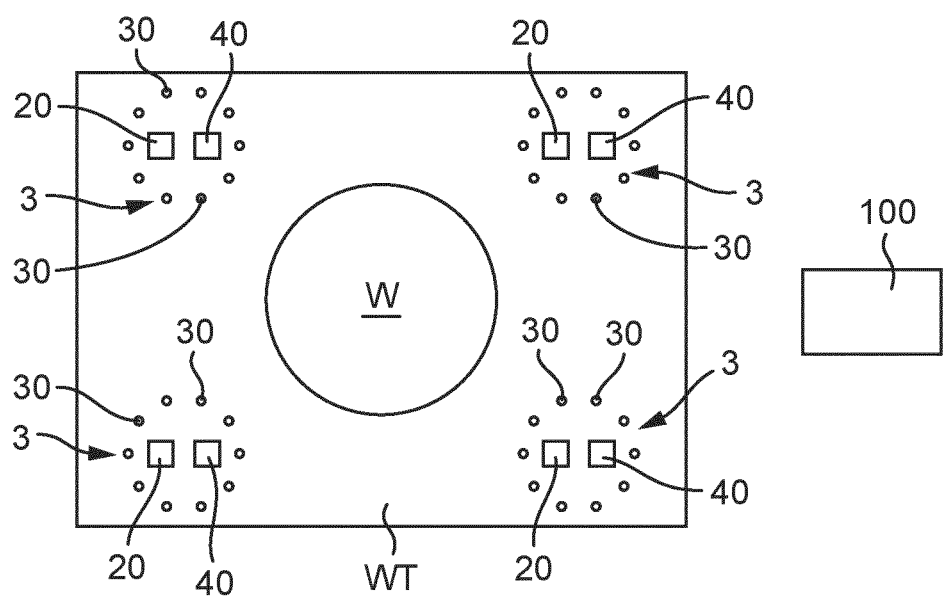

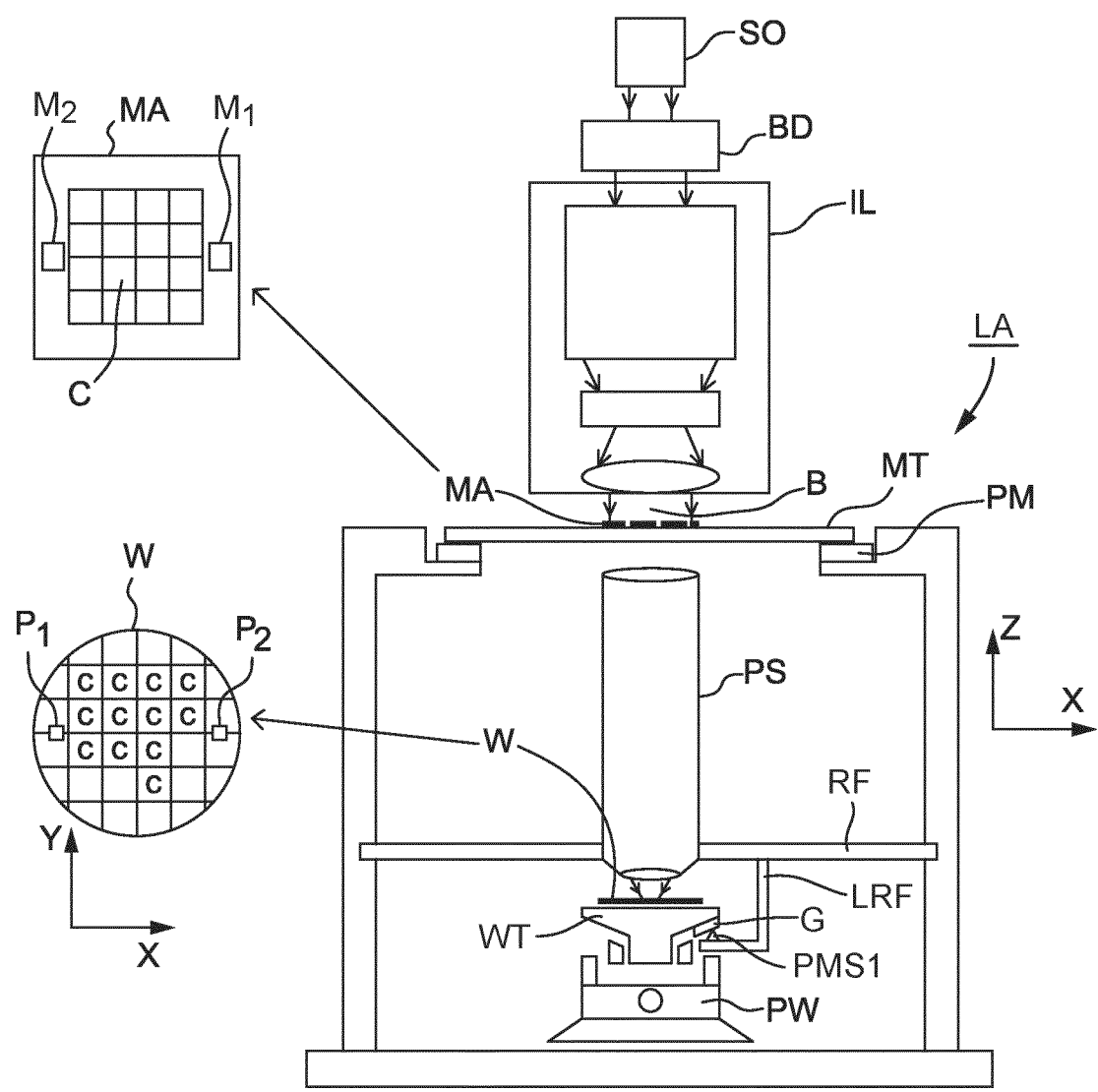

SYSTEM, LITHOGRAPHIC APPARATUS AND METHOD

CROSS-REFERENCE TO RELATED APPLICATIONS

This application is the U.S. national phase entry of PCT Patent Application No. PCT/EP2021/058680 which was filed on Apr. 1, 2021, which claims the benefit of priority of Netherlands Patent Application No. 2025372 which was filed on Apr. 20, 2020 and of U.S. patent application Ser. No. 63/013,170 which was filed on Apr. 21, 2020, and which are incorporated herein in their entireties by reference.

FIELD

The present description relates to a system for measuring a beam, a lithographic apparatus comprising the system, and a method of measuring the beam.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as "Moore's law". To keep up with Moore's law the semiconductor industry is chasing technologies that enable them to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

A lithographic apparatus may include an illumination system for providing a projection beam of radiation, and a support structure for supporting a patterning device. The patterning device may serve to impart the projection beam with a pattern in its cross-section. The apparatus may also include a projection system for projecting the patterned beam onto a target portion of a substrate.

In a lithographic apparatus, the substrate to be exposed (which may be referred to as a production substrate) may be held on a substrate support (sometimes referred to as a wafer table). The substrate support may be moveable with respect to the projection system.

Before the exposure phase one or more properties of the substrate is/are sensed during a sensing phase. At least one of the one or more properties may be sensed by an alignment system. For example, a surface topography of the substrate may be measured during the sensing phase. This process is sometimes known as levelling or levelling scanning. Additionally or alternatively, the property which is sensed may be the position of alignment marks on the substrate relative to other alignment marks provided on, e.g., a substrate support on which the substrate is supported. This process is known as an alignment or alignment scanning. The properties sensed during the sensing phase are used during the exposure phase to ensure correct focus of the patterned beam of radiation on the substrate and/or correct positioning of the patterned beam of radiation on the substrate.

SUMMARY

Measurement radiation beams are used for determining the position of the substrate support relative to the projection system, alignment system and/or alignment systems or an intermediate body such as a grid configured to cooperate with an encoder system or such as a reference frame. The grid might otherwise be referred to as a grating plate.

A measurement radiation beam in some lithographic apparatuses (such as atmospheric lithographic apparatus) passes through gas along a path of radiation. Local fluctuations in one or more characteristics of gas through which a measurement radiation beam passes can affect the measurement radiation beam, leading to measurement errors. Systems can protect a measurement radiation beam from such fluctuations by using a purging gas (e.g., air). Unfortunately, purging cannot prevent all environmental gas (e.g., air) from entering the path of the measurement radiation beam. Disturbances to the path of the measurement radiation beam can be reduced by controlling temperature and/or humidity offset between the purging gas and the surrounding gas. Thus, some methods use a temperature sensor to measure the temperature and/or humidity of the purging gas and another one to measure the environmental gas that the measurement radiation beam travels through. In this way, one or more characteristics of the purging gas can be controlled to reduce or minimize the disturbances to the measurement radiation beam which would affect the measurement accuracy. However, this can be intrusive and impractical to implement. Therefore, it is an aim of one or more embodiments described herein to provide a system which accurately measures using a measurement radiation beam without, e.g., implementing such intrusive and/or impractical measures.

An object is to provide a system for measuring a beam in which the accuracy of the measurement can be improved.

In an embodiment, there is provided a system for measuring a measurement beam, the system comprising: a measurement device configured to measure the measurement beam and determine a signal based on the measured measurement beam; and a fluid supply device configured to provide fluid as a fluid stream to, or surrounding, the measurement beam, wherein the system is configured to calculate noise of the signal, and to adjust a parameter of the fluid of the fluid stream to reduce the calculated noise.

According to an embodiment, there is provided a lithographic apparatus comprising such a system.

According to an embodiment, there is provided a method of reducing noise of a system for measuring a measurement beam, the method comprising: providing the measurement beam; providing fluid as a fluid stream to, or surrounding, the measurement beam; measuring the measurement beam and determining a signal based on the measured measurement beam; calculating noise of the signal; and adjusting a parameter of the fluid to reduce the calculated noise.

Further embodiments, features and advantages, as well as the structure and operation of various embodiments, features and advantages, are described in detail below with reference to the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 is a cross-sectional view of a substrate support;

FIG. 3 is a plan view of the substrate support of FIG. 2;

FIG. 9 schematically depicts an overview of a lithographic apparatus;

The features shown in the figures are not necessarily to scale, and the size and/or arrangement depicted is not limiting. It will be understood that the figures include optional features which may not be essential to the invention. Furthermore, not all of the features of the system and/or lithographic apparatus are depicted in each of the figures, and the figures may only show some of the components relevant for a describing a particular feature.

DETAILED DESCRIPTION

In the present document, the terms "radiation", "beam" and "radiation beam" are used to encompass all types of electromagnetic radiation, including ultraviolet radiation (e.g. with a wavelength of or about 436, 405, 365, 355, 248, 193, 157, 126 or 13.5 nm), as well as particle beams, such as ion beams or electron beams.

The term "lens", where the context allows, may refer to any one or combination of various types of optical components, including refractive, reflective, magnetic, electromagnetic and electrostatic optical components.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
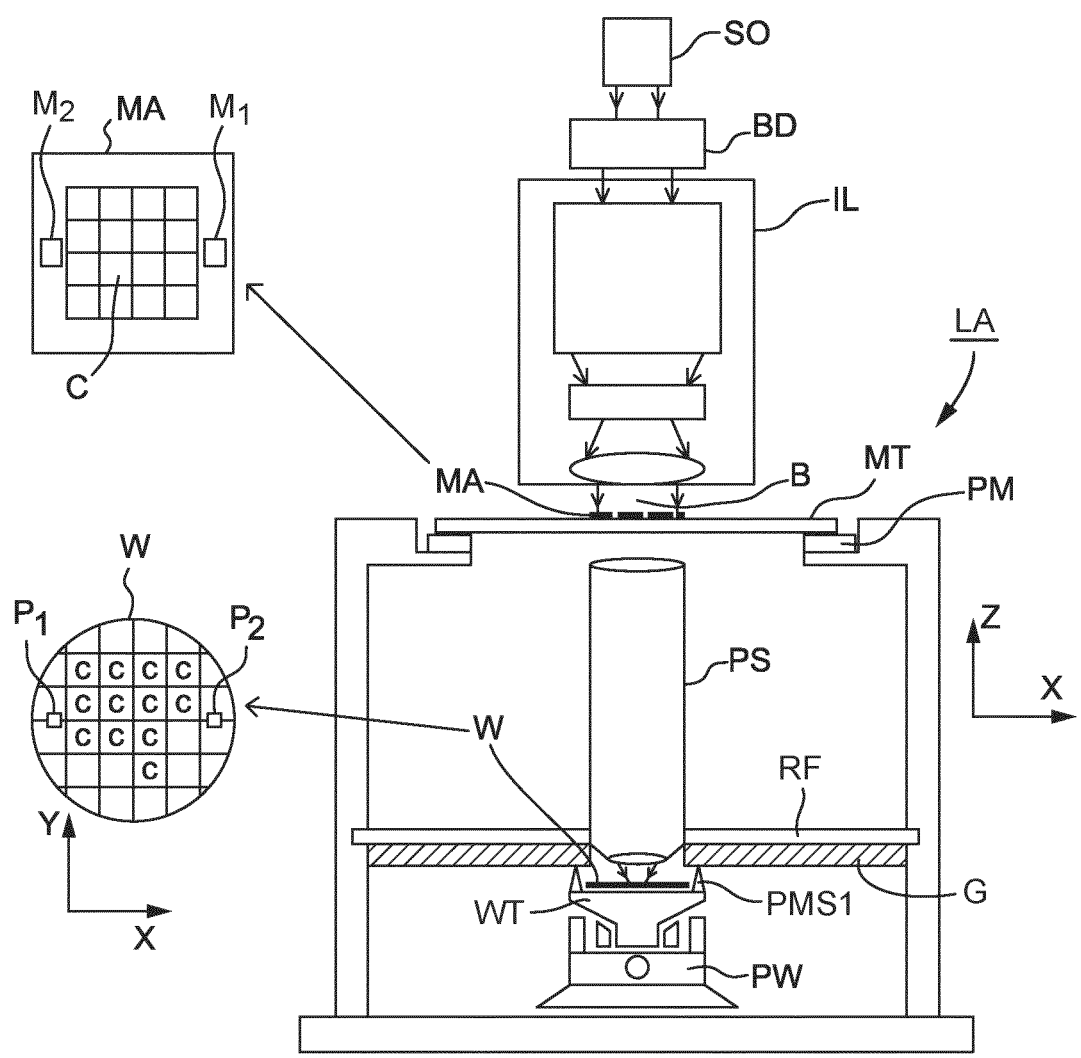
FIG. 1 schematically depicts an overview of a lithographic apparatus.

FIG. 1 schematically depicts a lithographic apparatus LA. The lithographic apparatus LA includes an illumination system (also referred to as illuminator) IL configured to condition a radiation beam B (e.g., EUV radiation or DUV radiation), a patterning device support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W. The substrate support WT may otherwise be referred to as a substrate stage.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate W may be covered by an immersion liquid having a relatively high refractive index, e.g., water, so as to fill an immersion space between the projection system PS and the substrate W—which is also referred to as immersion lithography. More information on immersion techniques is given in U.S. Pat. No. 6,952,253, which is incorporated herein in its entirety by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the patterning device support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a first position measurement system PMS1, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

The depicted lithographic apparatus could be used in a scanning mode, i.e. as a scanner. In the scanning mode, the patterning device support MT and the substrate support WT are scanned synchronously while the patterned beam of radiation is projected onto a target portion C (i.e. a single dynamic exposure). The velocity and direction of the substrate support WT relative to the patterning device support MT may be determined by the (de-)magnification and image reversal characteristics of the projection system PS.

In this specification, a Cartesian coordinate system is used. The Cartesian coordinate system has three axes, i.e., an x-axis, a y-axis and a z-axis. Each of the three axis is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Before the exposure phase one or more properties of the substrate W may be sensed during a sensing phase. The surface topography of the substrate W may be measured (often called leveling or leveling scanning) during the sensing phase. Additionally or alternatively, the position of substrate alignment marks P1, P2 on the substrate W relative to alignment marks on the substrate support WT may be measured (often called alignment or alignment scanning) during the sensing phase. The properties sensed during the sensing phase are used during the exposure phase to ensure correct focus of the patterned beam of radiation B on the substrate W and/or correct positioning of the patterned beam of radiation on the substrate W.

It will be understood that in a lithographic apparatus it is necessary to position various components with great accuracy. For example, during an exposure phase and a sensing phase, the position of the substrate support WT relative to a reference system RF may be determined. A position measurement system (such as the first position measurement system PMS1) may be provided for determining the position of the substrate support WT relative to the reference system RF. The position measurement system can determine the position of the substrate support WT relative to the reference system RF via a path of radiation (i.e. a measurement beam) between the substrate support WT and the reference system RF. By knowing (i) the position of the substrate support WT relative to the reference system RF, (ii) the position of the reference system RF relative to the projection system PS, and (iii) the position of the substrate W relative to the substrate support WT, the position of the substrate W relative to the patterned beam of radiation B may be determined.

In a normal atmospheric environment of a lithography machine, a heat load from one or more components near the position measurement system will create a temperature, pressure and/or humidity disturbances in the gas (e.g., air) through which the measurement beam travels. The reflected measurement beam, affected by these disturbances, will have a measurement error which results in overlay error and/or focus performance reduction. Thus, variations (e.g. in temperature, pressure and/or humidity) in the environment through which the measurement beam passes can affect the measurement accuracy.

Some measurement systems purge gas in the same direction as the measurement beam, to provide a protected volume in which the measurement beam travels. Unfortunately, purging cannot prevent all environmental gas from entering the protected volume. Since a temperature and/or humidity offset between the purging gas and the surrounding gas will likely exist, the measurement beam is disturbed, resulting in measurement error. In an ideal case, the humidity and/or temperature of the purging gas would be the same as the surrounding gas. Some systems use thermal optimization of the environment by measuring the temperatures (and/or humidities) in relevant areas and adjusting them to achieve a thermally matched level. Specifically, to try to address the problem, some systems use at least one sensor, e.g. a temperature sensor and/or humidity sensor, to measure the temperature and/or humidity of the purging gas, and at least one other sensor to measure the temperature and/or humidity of the surrounding environmental gas. However, this process is currently intrusive and impractical to implement.

Thus, it is beneficial to provide a system which can be used to measure a radiation beam, e.g., measurement beam, accurately, particularly in systems where temperature and/or humidity fluctuates in a medium through which the radiation beam, e.g. measurement beam, passes. Desirably, the system would also measure the radiation beam, e.g., measurement beam, in a way which is more practical to implement. A measurement beam can be used to determine the position of different components, and thus, improved accuracy allows more accurate determination of the relative position of different components. Some, but not all, of the possible uses of such a system are described below. It will also be understood that the examples relate to a lithographic apparatus due to the need for great accuracy. However, the system could be used in any other apparatus and devices which measures a distance and/or position, for example, in any metrology tool.

An embodiment of the present invention provides a system for measuring a beam. As described further below, the system may be provided in various locations and/or apparatuses. The system may be the same as, or part of, the position measurement system as described above.

The beam used is any beam which can be measured using the system. The beam may be at least one selected from: a measurement beam, light beam, optical beam, beam of radiation, or projection beam. There is overlap between some of these definitions. Any of these beams may be used interchangeably as appropriate.

The term "measurement beam" is used throughout the description below. The term "measurement beam" means any appropriate beam which can be measured in the system, and thus this term is interchangeable with the term "beam". The beam may be a beam emitted from a radiation source. Alternatively, the beam may be a projection beam, i.e. the beam may be at least part of the beam from the projection system PS. For example, the beam may be radiation beam B described above.

Different types of beam may be used. The measurement beam may be a beam of radiation. As above, the measurement beam may thus encompass all types of electromagnetic radiation, including ultraviolet radiation, as well as particle beams, such as ion beams or electron beams. The measurement beam may a light beam and may otherwise be referred to as an optical beam.

The system comprises a measurement device configured to measure the measurement beam. The measurement device may comprise any appropriate sensor which is capable of detecting the measurement beam. For example, the measurement device may comprise an optical sensor. The measurement device may be an encoder/position device, a levelling device, an alignment device, etc.

The measurement device is configured to determine a signal based on the measured measurement beam. The signal may be an electronic signal which is an output from the sensor. As the signal corresponds to the measurement beam, variations in the measurement beam will lead to variations in the signal. For example, the signal may be proportional to the measurement beam. In this way, the signal can be used to represent the measured measurement beam.

The system may comprise a source for emitting the measurement beam. The source may be part of the measurement device and/or sensor. The source may be any source capable of emitting an appropriate measurement beam. The source may be a radiation source, i.e. a source of a radiation beam to be used for measurement.

The system includes a fluid supply device configured to provide fluid. The fluid supply device can provide fluid as a fluid stream. The fluid stream may be provided along the measurement beam, such that the fluid is provided substantially along the length of the measurement beam. The fluid supply device may comprise a fluid supply unit containing the fluid. The fluid supply device may comprise at least one opening through which the fluid can be provided as a fluid stream. The fluid stream may otherwise be referred to as a fluid shower, fluid barrier, or a fluid curtain. The fluid stream may be provided as purging gas as described above (as long as it is provided to, or surrounding, the measurement beam as described below). The fluid might be a gas, or a liquid, or a combination of gas and liquid. As an example only, the fluid may be air, and optionally, the air may be cleaned or filtered.

The fluid stream may be provided to the measurement beam. For example, the fluid stream may be provided such that the fluid stream traverses the measurement beam, i.e. the fluid stream and an optical axis of the measurement beam are not parallel to each other. In this case, the fluid stream is desirably provided substantially perpendicular to the measurement beam. Alternatively, the fluid stream may be provided surrounding the measurement beam. In this case, the fluid stream may be provided in such a way as to form a fluid barrier or fluid curtain around the measurement beam. In this way, the fluid surrounding the measurement beam can be controlled.

The system is configured to calculate noise of the signal. For example, the system may carry out one or more processing steps on the beam to determine the noise of the signal. The system may comprise a processor to determine the noise. There are various different ways that the noise may be determined from the measured beam. Any appropriate method may be used. As an example only, the noise could be determined by measuring the measurement beam when the relevant components (e.g. a source configured to emit the measurement beam and a sensor configured to detect the measurement beam, and a component which reflects the measurement beam) are kept stationary. When the relevant components are stationary, a stable (i.e. non-changing) measurement beam is expected, and thus a stable signal is expected. However, there will be noise on the signal, which is partly due to temperature and/or humidity fluctuations of the medium through which the measurement beam passes. By processing this signal, for example, by looking at the power spectrum density, one could have a look at specific frequencies in the signal which are known to be related to temperature and/or humidity fluctuations. From this, the noise could be determined. As indicated above, one or more other methods of determining the noise may alternatively or additionally be used.

The processor used to determine the noise of the signal may be part of the measurement device. The processor may process any of several types of noise, for example, noise on a raw signal, noise on a filtered signal, and/or noise on a signal after processing. The processor may process noise from multiple signals, e.g. by combining with one or more other optical sensors. The processor can be used with any type of noise and/or focus on a specific frequency domain.

The system is further configured to adjust a parameter of the fluid of the fluid stream to reduce the calculated noise. For example, the system may be configured to calculate the noise when a parameter is at a first value, the system may be configured to adjust the parameter and determine whether the noise increases or decreases. Depending on the variation of the noise when the parameter is adjusted, the system may be configured to adjust the parameter to reduce the noise. A method is described in further detail below. Alternatively, a relationship may be known between a parameter and the noise of the signal corresponding to the measured beam. In this case, the parameter can be adjusted to a value which corresponds to a reduced amount of noise. Desirably, the parameter will be adjusted to a point at which the noise is at a minimum.

As described above, systems may try to match temperature of purging gas to the temperature of surrounding gas by measuring the temperature of the supply of the surrounding gas. However, the temperature of this supply gas may increase when around the substrate support WT, e.g. due to heat emitted from at least one component. Therefore, the measurement of the temperature may be inaccurate. The same is true for humidity measurements, which may have even higher inaccuracies. An embodiment of the invention as described here may address one or more such issues because the system may not rely on measurements of the temperature and/or humidity in order to match purging conditions. As described, the system directly measures noise of the signal, which accounts for refractive index error in the measured measurement beam, and then adjusts at least one parameter of the fluid of the fluid stream to produce a measurement system with a reduced, or desirably the least, amount of noise. In other words, the system does not need to carry out additional measurements of one or more certain parameters of the fluid being supplied, the noise is used to adjust a selected parameter to reduce the noise, and thus reduce the error related to the above described inaccuracies.

There are various possible advantages associated with one or more embodiments as described herein. If during diagnostics, it is believed that the calibration has caused an error, it is a matter of resetting a single parameter to address the calibration issue. Additionally, an embodiment of the system can effectively skip any interim contributors (e.g., measuring temperature of supply gas) and go straight to a higher level contributor (i.e. the noise) which should making it a more direct and reliable optimization test, and should improve the overlay performance. This can provide improved accuracy of a measurement system without one or more additional sensors, and thus is an alternative option to hardware solutions. This means that one or more additional sensors may not be needed, thus reducing costs. It will be noted that the measurements made by the present system may be more robust than those made with other systems because the parameter adjustment will reduce the noise, desirably to a minimum, which will therefore take into account other direct and indirect environmental factors that affect the noise.

The parameter adjusted by the system may be at least one selected from: temperature, pressure, humidity, fluid composition (e.g. $O_2$, $N_2$ or $CO_2$), and/or $CO_2$ content. Each of these parameters may affect the refractive index of the medium through which the measurement beam travels. Each of the parameters may have varying impact on the refractive index.

Desirably, the temperature is controlled because it is easy to implement. The temperature of the fluid may be controlled by using at least one heater in or adjacent to the fluid supply, and/or by having cooling fluid running adjacent to the fluid supply. The temperature of the fluid can be adjusted by using at least one heat exchanger in combination with a temperature-controlled fluid. For example, gas (e.g. conditioned air) may be used which is conditioned with temperature-controlled liquid (e.g., water) via the heat exchanger. For example, one or more Peltier elements may be used, optionally in combination with at least one heater, to condition the fluid. This can be done directly, or indirectly via one or more heat exchangers with liquid.

Adjusting the fluid composition might be carried out by including an additional fluid with a different refractive index with the fluid of the fluid stream. For example, adjusting the fluid composition can be done by adding an additional line with the additional fluid to the fluid supply, e.g. with a mixing valve which can be controlled to add the right amount of the additional fluid.

The system may comprise multiple measurement devices and/or fluid supply devices. The measurement devices may have corresponding fluid supply devices, e.g., there may be one fluid supply device per measurement device. There may be multiple measurement devices per fluid supply device, or multiple fluid supply devices per measurement device. There may be four measurement devices and corresponding fluid supply devices, wherein the four measurement devices are configured to determine a position of the measurement device. The system comprising the devices may form the position measurement system. This is described below in relation to FIGS. 1, 2 and 3.

A further advantage is that the system can be used in a wide variety of scenarios. The system can be used as part of any optical measurement system which is purged, i.e. for which fluid is provided as a fluid stream. Although the examples relate to use in a lithographic apparatus, the system could be used in any appropriate apparatus.

Within a lithographic apparatus, the system can be used in any appropriate location. For example, the system can be used for a substrate support position sensor, an alignment sensor, a level sensor, a patterning device position sensor, and/or any other component for which distance measurement is to be carried out.

More specifically, the measurement device may be positioned on a patterning device support MT, a patterning device reference system facing the patterning device support MT, a substrate support WT configured to support a substrate W, or the reference system RF facing the substrate support WT. Any reference in the description to facing the substrate support WT is interchangeable with facing the substrate W, which can be positioned on the substrate support WT.

The system may be provided on a single component, i.e. with the measurement device and the fluid supply being formed on the same component. Alternatively, the system may be provided on multiple components, i.e. different parts of the system may be provided on different components. For example, if the measurement device is on the substrate support WT, the fluid supply device may be positioned on the substrate support WT, or alternatively, the fluid supply device could be positioned on the reference system RF facing the substrate W/substrate support WT. If the measurement device is on the reference system RF facing the substrate W/substrate support WT, the fluid supply device may be positioned on the reference system RF facing the substrate W/substrate support WT, or alternatively, the fluid supply device could be positioned on the substrate support WT. If the measurement device is on the patterning device support MT, the fluid supply device may be positioned on the patterning device support MT, or alternatively, the fluid supply device could be positioned on a patterning device reference system facing the patterning device support MT. If the measurement device is on the patterning device reference system facing the patterning device support MT, the fluid supply device may be positioned on the patterning device reference system facing the patterning device support MT, or alternatively, the fluid supply device could be positioned on the patterning device support MT. Other combinations can be envisaged more generally in which the measurement device is positioned on the same, or a different component, than the fluid supply device.

An embodiment in which the measurement device is positioned on the substrate support WT is described below in relation to FIGS. 1, 2 and 3. An embodiment in which the measurement device is positioned on a position measurement system facing the substrate support WT is described below in relation to FIGS. 4 and 5. An embodiment in which the measurement device is positioned on a patterning device reference system facing the patterning device support MT is described below in relation to FIG. 6. An embodiment in which multiple measurement devices are positioned facing the substrate W is depicted in FIG. 7.

An embodiment of a system for measuring a measurement beam is depicted in FIGS. 2 and 3. Specifically, FIGS. 2 and 3 show an embodiment in which measurements are taken to determine a position of the substrate support WT relative to the reference system RF. FIGS. 2 and 3 are a side view and a plan view respectively of a substrate support WT. The system as shown in FIG. 2 comprises a radiation output (e.g., radiation source) 20 for emitting a measurement beam 50. The system comprises a measurement device comprising sensor (e.g., an input to a sensor detector, a sensor detector, etc.) 40 for detecting the measurement beam 50. The measurement beam 50 is projected towards a grid G of the reference system RF. For reference, the grid G is shown in FIG. 1, as being positioned on the reference system RF. In this embodiment the position of the grid G relative to the projection system PS is known. In the embodiment illustrated, the reference system RF may be implemented by a reference frame, indicated here by the same acronym RF. The position of the grid G relative to the reference frame RF is known and may or may not be fixed. The relative position of the reference frame RF to the projection system PS is known. The position of the reference frame RF relative to the projection system PS may or may not be fixed. In this way the grid G is in a known position relative to the projection system PS. The measurement beam 50 is reflected and/or refracted by the grid G back to the sensor 40. The measurement beam 50 travels along a path of radiation. The sensor 40, configured to detect the measurement beam 50, is used to indicate the position and/or movement of the grid G relative to the radiation output 20 and/or the sensor 40. The sensor 40 measures displacements of the substrate support WT relative to the grid G. Therefore, the position of the substrate support WT relative to the projection system PS can be determined. This is possible because the position of the grid G relative to the projection system PS is known as described above.

A respective combination of the radiation output 20 and the sensor 40 is most conveniently positioned at a respective one of the corners of the substrate support WT, for example as shown in FIG. 3 as explained further below. This convenient position is due to the center of the substrate support WT being taken up by the substrate W. Furthermore, pairs of diametrically positioned combinations are involved in determining an angular displacement of the substrate support WT about an axis parallel to the Z axis (see the diagram of FIG. 1). The angular displacement can be determined with higher accuracy if the distance between the diametrically positioned combinations is larger. For more background, see, e.g., U.S. Pat. No. 7,602,489, incorporated herein in its entirety by reference.

Although FIG. 3 indicates the use of four radiation outputs 20 with four corresponding sensors 40, it will be understood that any appropriate number of radiation outputs 20 and/or sensors may be used in the system. Additionally, the radiation outputs 20 and/or sensors 40 may be positioned wherever is appropriate, or even advantageous, depending on other components, such as those on the substrate support WT.

As described above, the system uses the measurement beam 50. The measurement beam 50 travels along the path of radiation. As described above, ambient gas through which the measurement beam passes along the path of radiation may affect the measurement beam 50. As described, several factors can affect how the measurement beam 50 propagates through a gas. For example, temperature of the gas, humidity of the gas and/or composition of the gas are factors which may affect the refractive index of a gas. Localized variations of one or more of these factors and/or turbulence in the gas can result in non-uniformity in the refractive index of the gas. The measurement beam 50 passing through the gas is affected by variation in the refractive index. For example, a change in the refractive index can alter the trajectory of the measurement beam 50. Additionally or alternatively, a change in the refractive index can introduce wavefront error into the measurement beam 50. Measurement error can be induced by variation in the refractive index along the path of radiation. Measurement error can lead to positioning inaccuracy in the positioning of one or more components, e.g. substrate support WT, of the lithograph apparatus. Any such positioning inaccuracy can alter the placement of the patterned beam of radiation B on the substrate W and so can have a detrimental effect on overlay and/or focus.

Arrangements are in place to try to reduce the fluctuation in the refractive index of gas in a volume traversed by the path of radiation. For example, in an embodiment fluid supply device 3 is provided. The fluid supply device 3 is configured to provide a fluid as a fluid stream to, or surrounding, the measurement beam 50. Therefore, one or more parameters of the gas in the volume through which the measurement beam 50 passes can be controlled.

In this embodiment, the fluid supply device 3 ejects fluid from at least one opening 30 in a surface of the substrate support WT. The fluid may be a barrier gas and may form a gas curtain 13 which impedes the flow of ambient gas on one side of the gas curtain 13. The gas curtain 13 can be provided around the volume such that the gas within the volume is effectively separated from the ambient gas outside the volume. The gas within the volume can be conditioned such that it is more uniform than the gas outside of the volume. Therefore, the gas curtain 13 formed by the fluid stream can be used to provide a barrier around the volume traversed by the path of radiation of the measurement beam 50. This protects the measurement beam 50 from the effects of changes in ambient gas outside the volume. The gas within the volume is referred to as the protected gas.

As shown in FIG. 2, the system may comprise multiple measurement devices and/or fluid supply devices 3. The substrate support WT is illustrated at an imaging location under the projection system PS. However, in an embodiment the at least one fluid supply device 3 may instead be part of the reference system RF and mounted substantially stationary relative to the projection system PS (e.g., accommodated on the reference frame RF) along with the radiation output 20 and sensor 40. In that embodiment, the grid G is not part of the reference system RF but moves with substrate support WT and is in known position relative to the substrate support WT (e.g., fixed to the substrate support WT).

In an embodiment, the grid G which is part of the reference system RF is additionally at a measurement location. One or more properties of a substrate W mounted on the substrate support WT, such as position of the substrate W on the substrate support WT, surface topography of the substrate W, etc., can be measured at the measurement location. In this embodiment, the grid G may be positioned above the substrate support WT (similar to the main embodiment described above) or may be positioned on the substrate support WT as described in the preceding paragraph.

On the substrate support WT of FIG. 3, four fluid supply devices 3 can be seen. Other objects may be included on the substrate support WT which have not been shown, for example a substrate holder configured to hold a substrate W or one or more other different types of sensors. In this embodiment, each fluid supply device 3 is configured to provide the gas curtain 13 operative to reduce an inflow of ambient gas into the volume traversed by the path of radiation between the substrate support WT and the reference system RF. Each of the fluid supply devices 3 shown comprises at least one opening 30 in the substrate support WT. The at least one opening 30 in the substrate support WT is adapted for a flow of fluid as a fluid stream. Specifically, in this case, the fluid is barrier gas from the at least one opening 30 for establishing the fluid stream, which in this case forms the gas curtain 13 enclosing part of the volume traversed by the path of radiation. Although four fluid supply devices 3 and four corresponding measurement devices are shown, it will be understood that any appropriate number of fluid supply devices 3 and corresponding measurement devices may be used, i.e. there may be a smaller or greater number.

FIG. 3 illustrates an embodiment of one or more fluid supply devices 3. In this embodiment, a plurality of individual openings 30 are provided in an upper surface of the substrate support WT surrounding a radiation output 20 and sensor 40. A controller 100 individually controls the flow of fluid (e.g. barrier gas) out of each of the openings 30 of the fluid supply device 3. The controller 100 controls the speed of fluid exiting each of the openings 30 relative to the respective opening 30. The speed of fluid relative to the respective opening 30 may be the same for each of the plurality of openings 30. Alternatively, the speed of the fluid relative to the respective opening 30 may vary between openings 30. For instance, any of openings 30 aligned with the radiation output 20 and/or sensor 40 in the principal directions of movement of the substrate support WT may have a higher fluid flow rate out of them than other openings 30. The controller 100 changes the speed of fluid relative to the respective opening 30 during the exposure phase compared to at least part of the sensing phase (e.g., the levelling scanning sub-phase). Because (i) the speed of the substrate support WT relative to the reference system RF is lower during the exposure phase than during the part of the sensing phase, and (ii) the time between the changes in direction of movement of the substrate support WT is lower during the exposure phase than during the at least part of the sensing phase (e.g., the levelling scanning sub-phase), the controller 100 decreases the speed of fluid exiting each of the openings 30 during the exposure phase compared to the part of the sensing phase (e.g., the levelling scanning sub-phase). As a result, any acoustic disturbances generated by the fluid are lower during the exposure phase than would be the case if the speed of fluid exiting each of the openings 30 relative to the respective opening 30 were not lower during the exposure phase.

Although the embodiment of FIG. 3 shows plural openings 30 per fluid supply system 3, a single elongate opening 30 may be present instead. A plurality of elongate openings 30 may be provided.

The embodiment of FIG. 3 has been described above with reference to the speed relative to the opening 30 when exiting the opening 30. However, in an embodiment, the controller 100 may control the volume of barrier gas exiting the openings 30 per unit of time.

As in the embodiment of FIG. 3 and all other embodiments, the system is configured to control at least one parameter of the fluid. More specifically, the controller 100 may be configured to control the at least one parameter. Alternatively, a separate controller or control device (not shown) may be used to control the at least one parameter. As described above, the at least one parameter may be one or more selected from: temperature, pressure, humidity, fluid composition, and/or $CO_2$ content. The at least one parameter is controlled based on the calculated noise of the signal. Additionally, the at least one parameter may be varied depending on whether in the exposure phase or in a certain part of the sensing phase (e.g., the levelling scanning sub-phase). The controller 100 may be provided in combination with any of the embodiments of the invention, e.g. as shown in the other Figures.

As described in relation to FIGS. 2 and 3, the fluid may be provided as a fluid stream which surrounds the measurement beam 50. However, a different configuration may also be provided. Specifically, the fluid stream may be provided to the measurement beam 50. In other words, the fluid stream may be provided such that the fluid stream traverses the measurement beam 50, e.g. the fluid stream and an optical axis of the measurement beam are not parallel to each other and cross one another. In this case, the fluid stream may be desirably provided substantially perpendicular to the measurement beam 50. In the embodiment shown in FIGS. 2 and 3, this could be implemented by providing the fluid supply device 3 to have at least one outlet for the fluid between the substrate support WT and the grid G. In this instance, the fluid supply device 3 may have at least one outlet, and/or an elongated outlet arranged between the substrate support WT and the grid G. The at least one outlet and/or the elongated outlet may be arranged to provide fluid along the length of the measurement beam 50. An example of this arrangement of the fluid stream/fluid supply device 130 relative to the measurement beam 50 is shown in FIG. 5. Although the system is in a different position in FIGS. 4 and 5 than in FIGS. 2 and 3, it will be understood that the system as shown in FIGS. 2 and 3 could be adapted to provide a fluid stream which traverses the measurement beam 50 as shown in FIGS. 4 and 5.

Figure 4:
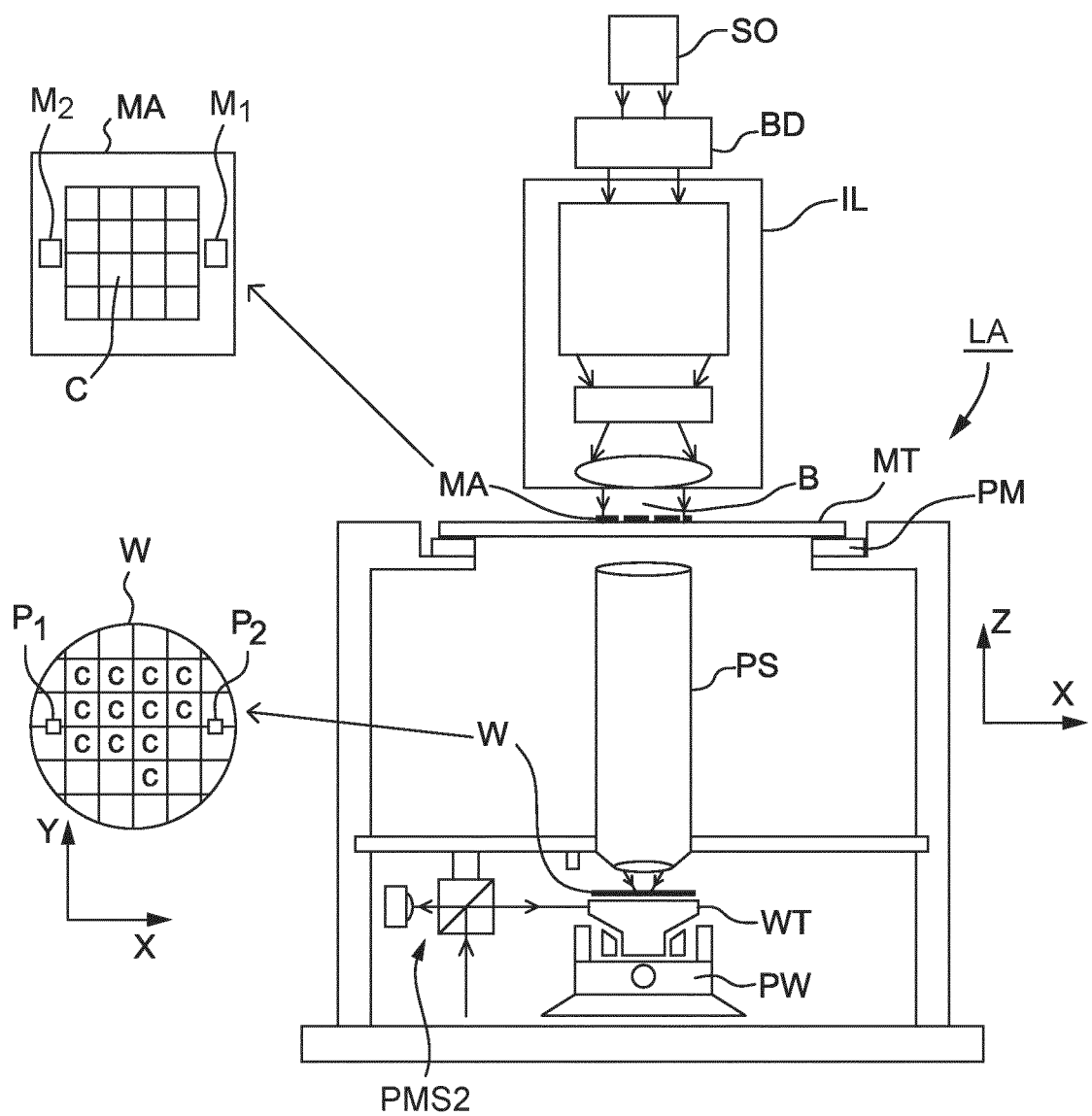
FIG. 4 schematically depicts an overview of a lithographic apparatus.
Figure 5:
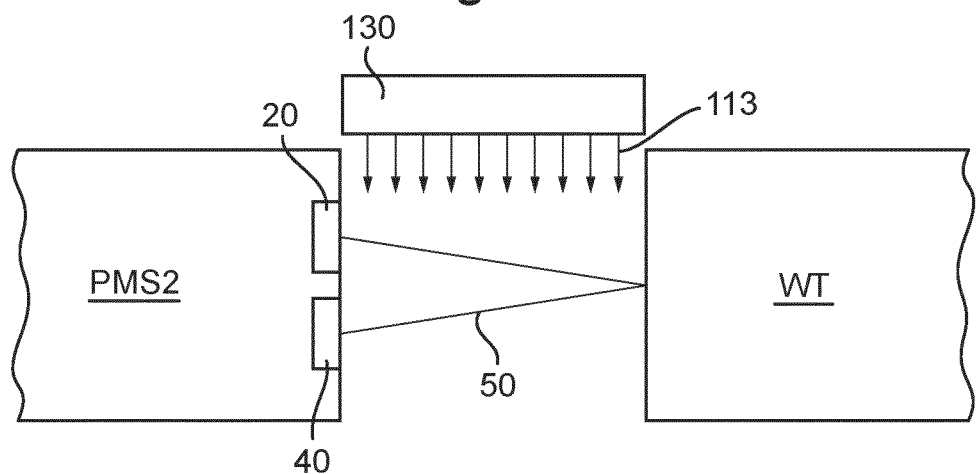
FIG. 5 is a cross-sectional view of a substrate support.

A further embodiment is shown in FIGS. 4 and 5, in which the above described first position measurement system PMS1 is replaced with the second position measurement system PMS2. The second position measurement system PMS2 may work in a similar way to the first position measurement system PMS1. A close-up of the second position measurement system PMS2 is shown in FIG. 5. It will be understood that these position measurement systems are depicted on different versions of the lithographic apparatus, but could be used in combination.

FIG. 5 includes similar features to those shown and described in relation to FIGS. 2 and 3. To avoid repetition, features which are the same as those shown in FIGS. 2 and 3 will not be described again. However, it will be understood that the system shown in FIGS. 4 and 5 may include any of the features of FIGS. 2 and 3 as appropriate, and as described in relation to these Figures.

The difference between the system shown in FIGS. 2 and 3, and the system shown in FIG. 4 relates to the position of the system within the lithographic apparatus. Specifically, the system of FIGS. 4 and 5 may be part of the second position measurement system PMS2 which is positioned on the reference system RF. As shown the second position measurement system PMS2 may be located to the side of a substrate support WT, e.g. in a horizontal plane of the substrate support WT. In this instance the position of the second position measurement system PMS2 is known relative to the projection system PS, e.g. due to the reference system RF. There may be multiple measurement devices and/or fluid supply devices 130 which are used to determine the position of the substrate support WT.

Additionally, the system of FIGS. 2 and 3 differs from the system of FIGS. 4 and 5 due to the way in which the fluid is provided in relation to the measurement beam 50. As described in relation to FIGS. 2 and 3, the fluid may be provided by the system such that the fluid stream 113 traverses the measurement beam 50, as shown in FIG. 5. Alternatively, the system may be provided as shown in FIG. 5, except the fluid supply device 130 may be provided surrounding the measurement beam 50, i.e. with the fluid being provided as shown in FIGS. 2 and 3.

Although FIG. 1 shows the first position measurement system PMS1 and FIG. 4 shows the second position measurement system PMS2, it will be understood that these position measurement systems are interchangeable and could be provided in combination with each other, and including any combination of features described in the embodiments above.

Figure 6:
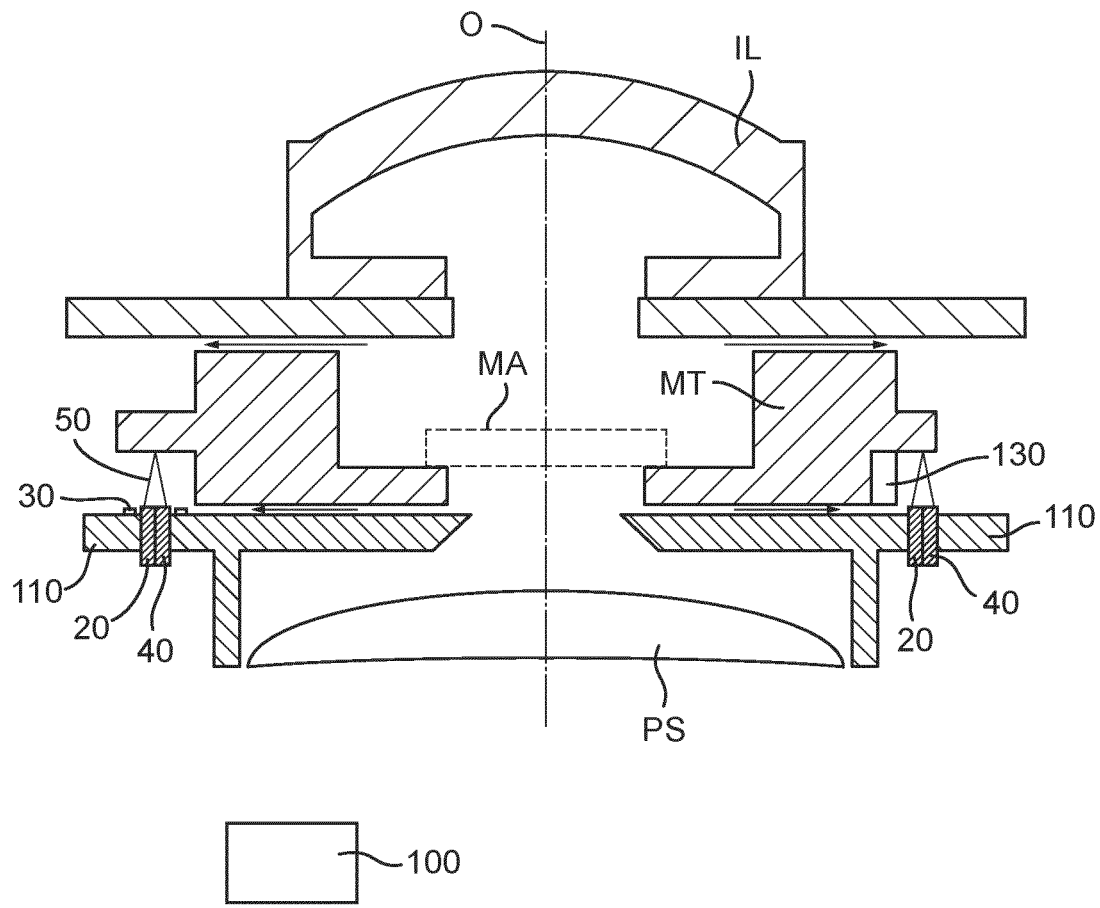
FIG. 6 is a cross-sectional view of a patterning device.
Figure 7:
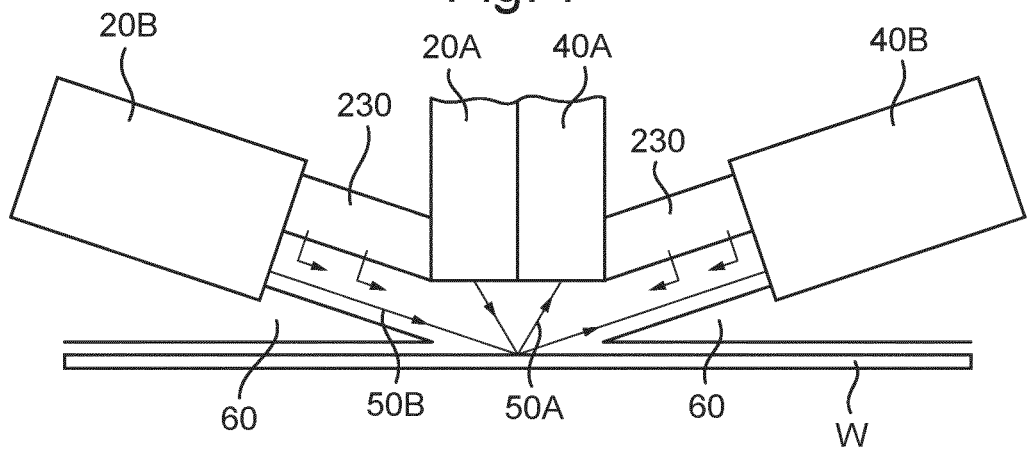
FIG. 7 is a cross-sectional view of a system and a substrate.

FIG. 6 includes similar features to those shown and described in relation to FIGS. 2, 3 and 5. To avoid repetition, features which are the same as those shown in FIGS. 2, 3 and 5 will not be described again. However, it will be understood that the system shown FIG. 6 may include any of the features of FIGS. 1-5 as appropriate, and as described in relation to these Figures.

The difference between the system shown in FIGS. 2 and 3, and the system shown in FIG. 6 relates to the position of the system within the lithographic apparatus. Specifically, the system of FIG. 6 may be part of a patterning device reference system 110 facing the patterning device support MT. In this instance the position of the patterning device reference system 110 facing the patterning device support MT is known relative to the projection system PS. There may be multiple measurement devices and/or fluid supply devices 130 which are used to determine the position of the patterning device support MT.

Fluid may be provided to the measurement beam 50 as shown in FIGS. 4 and 5, and as shown by fluid supply device 130 on the right-hand side of FIG. 6. Alternatively, fluid may be provided surrounding the measurement beam 50 as shown in FIGS. 2 and 3, and as shown by fluid supply device 30 on the left-hand side of FIG. 6. It will be understood that if multiple fluid supply devices are provided, the configuration of the fluid supply devices in a system may vary such as shown in FIG. 6. Alternatively, if multiple fluid supply devices are provided the system may provide fluid in the same way in all of the fluid supply devices. For example, all the fluid supply devices may provide the fluid to the measurement beam 50 as on the right hand side of FIG. 6, or all the fluid supply devices may provide the fluid surrounding the measurement beam 50, as on the left hand side of FIG. 6.

Most of the above embodiments describe that the fluid is provided as a fluid stream to the measurement beam 50. It will be understood that if multiple measurement beams 50 are provided, this fluid may also be provided to such multiple measurement beams 50. For example, if multiple measurement devices are provided as described in relation to FIG. 7, or if a measurement device utilizes multiple measurement beams 50.

FIG. 7 includes similar features to those shown and described in relation to FIGS. 2-5. To avoid repetition, features which are the same as those shown in FIGS. 2-5 will not be described again. However, it will be understood that the system shown FIG. 7 may include any of the features of FIGS. 1-6 as appropriate, and as described in relation to these Figures.

Specifically, the system of FIG. 7 may be positioned on a reference system RF facing the substrate W when in position. In this instance, the system is configured to provide fluid to a space between at least one measurement device and the substrate W.

There may be multiple measurement devices and/or fluid supply devices. Specifically, the fluid supply device 230 is configured to provide fluid to a first measurement beam 50A from a first sensor emitter 20A which is detected by a first measurement device 40A. Additionally, the fluid supply device 230 is configured to provide fluid to a second measurement beam 50B from a second sensor emitter 20B which is detected by a second measurement device 40B. In this instance, the first sensor 20A may be an alignment sensor. In this instance, the second sensor 20B may be a level sensor. It will be understood that the sensors used here are for example only and other sensors and detectors may be used.

The system shown in FIG. 7 comprises at least one barrier 60 used to direct the fluid stream. In this instance, the fluid of the fluid stream is directed over the barrier 60 and between a lower surface of the barrier 60 and the substrate W. This helps ensure that the fluid stream is provided to the first measurement beam 50A and the second measurement beam 50B.

The fluid supply device 230 may comprise multiple outlets as described, and as shown on the left-hand side and the right-hand side of FIG. 7. The fluid supply device 230 may control the outlets to emit the same amount of fluid, or different amounts of fluid. For example, the left-hand side outlet of the fluid supply device 230 may emit less than 50% of the fluid, and the right-hand side outlet of the fluid supply device 230 may emit more than 50% of the fluid. For example, one of the outlets of the fluid supply device 230 may emit less than or equal to 40% of the fluid, or less than or equal to 30% of the fluid, or less than or equal to 20% of the fluid. For example only, the one or more other outlets (e.g. the corresponding outlets) of the fluid supply device 230 may emit greater than or equal to 60% of the fluid, or greater than or equal to 70% of the fluid, or greater than or equal to 80% of the fluid.

Figure 8:
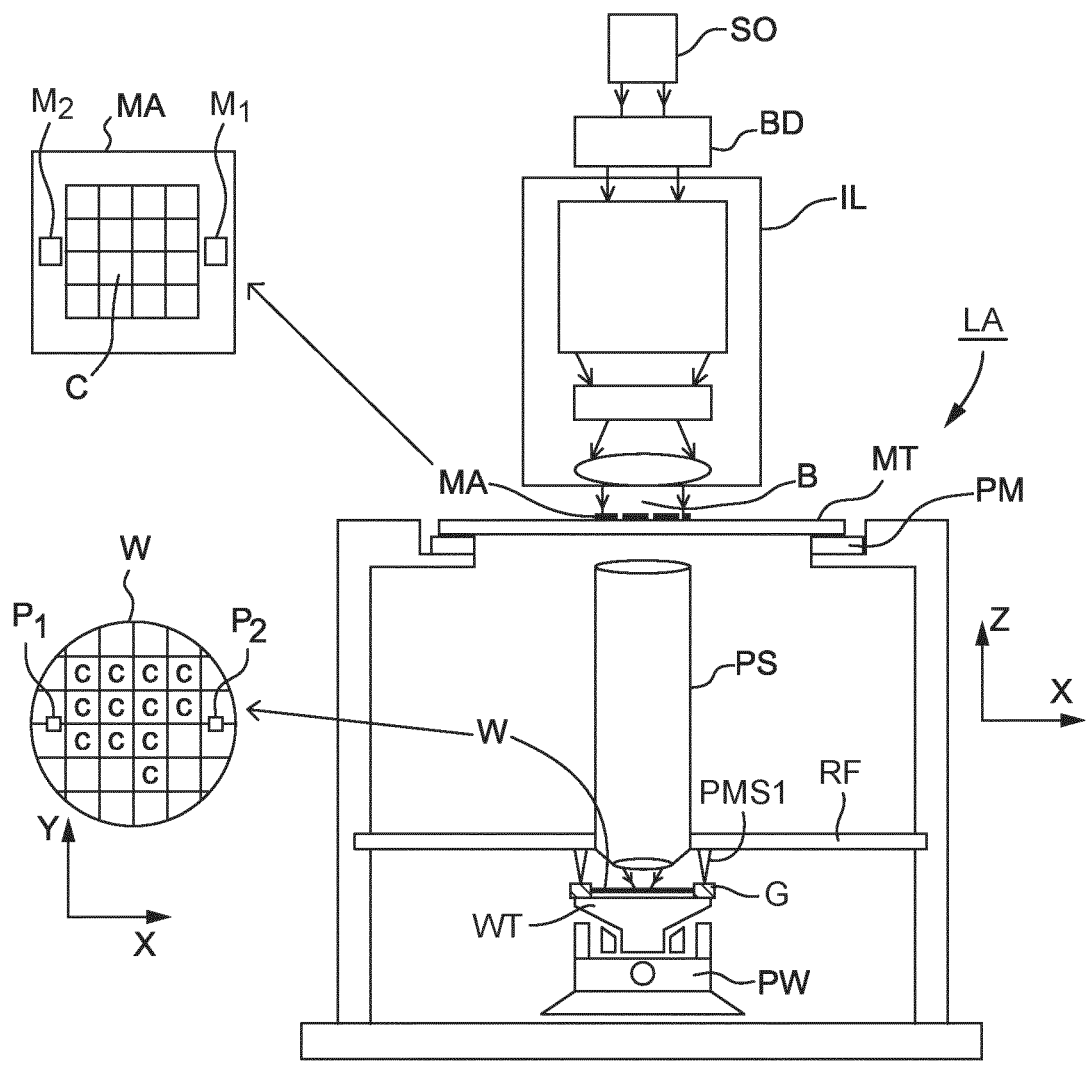
FIG. 8 schematically depicts an overview of a lithographic apparatus.

In some of the embodiments above, it is described that the apparatus may comprise grid G at the reference system RF and which has the radiation output 20 and sensor 40 accommodated at the substrate support WT. An embodiment is likewise applicable to another configuration, which has the grid G at the substrate support WT and which has the radiation output 20 and sensor 40 accommodated at the reference system RF as in FIG. 8. An embodiment is likewise applicable to another configuration, which has the grid G on the substrate support WT, and which has the radiation output 20 and sensor 40 accommodated below the substrate support WT, for example, being attached to a further reference system. For example, the further reference system may be an L-shaped bar LRF as shown in FIG. 9. The L-shaped bar LRF may optionally be connected to the reference system RF described above. In this instance, the grid G may be located on a lower surface of the substrate support WT such that it is facing the radiation output 20 and sensor 40. An embodiment is likewise applicable to another configuration which has the radiation output 20 and sensor 40 on the substrate support WT, and which has the grid G accommodated below the substrate support WT, for example, the grid G being attached to a different reference system, such as L-shaped bar LRF. In this instance, the radiation output 20 and sensor 40 may be located on a lower surface of the substrate support WT such that they are facing the grid G.

The grid G used in any of the above described embodiments may otherwise be referred to as a grating and may comprise any appropriate configuration, e.g. a scale, reflective grating, diffraction grating, etc. Thus, the grid G may be any appropriate component which allows measurement, such as a 1-D encoder grating plate, or a 2-D encoder grating plate.

In any of the above embodiments, the measurement device used may have the same features, and/or may be positioned, as in PCT patent application publication WO 2009-014252A1 and/or WO 2013-073538, each of which is hereby incorporated by reference in its entirety.

Figure 10A:
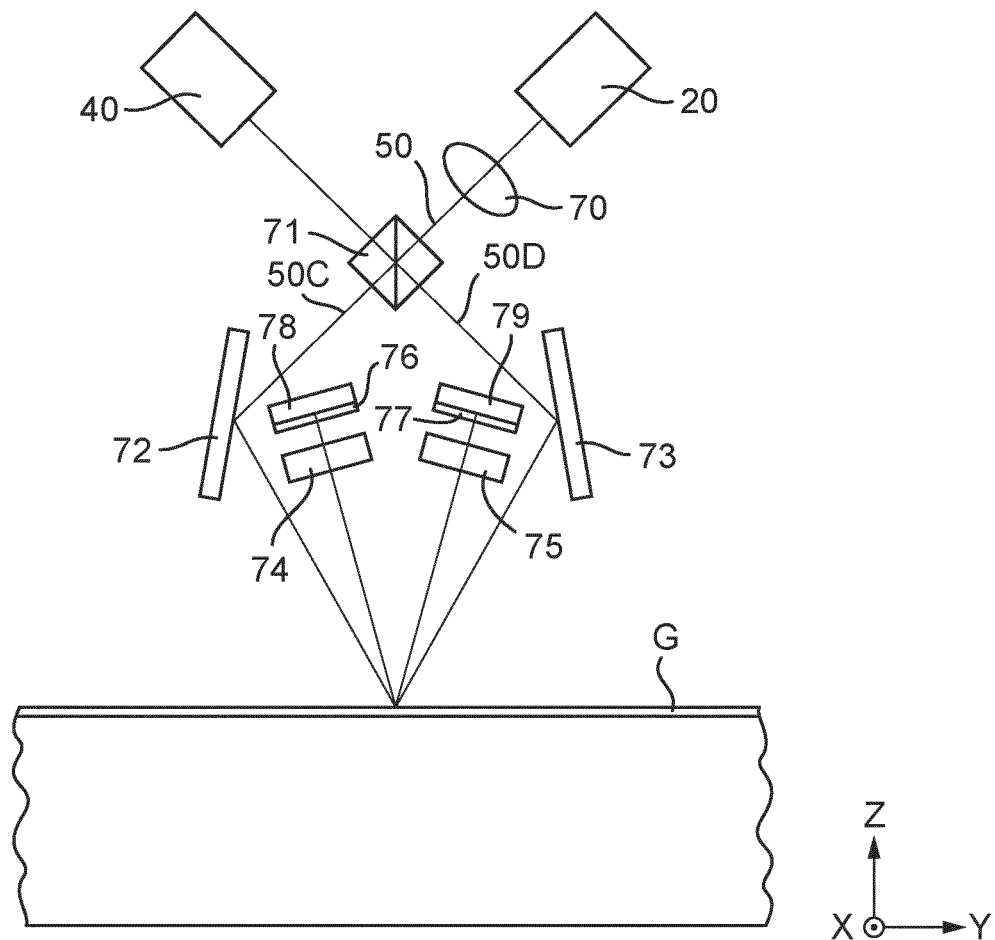
FIG. 10a is a cross-sectional view of a system and FIG. 10b shows a grid.
Figure 10B:
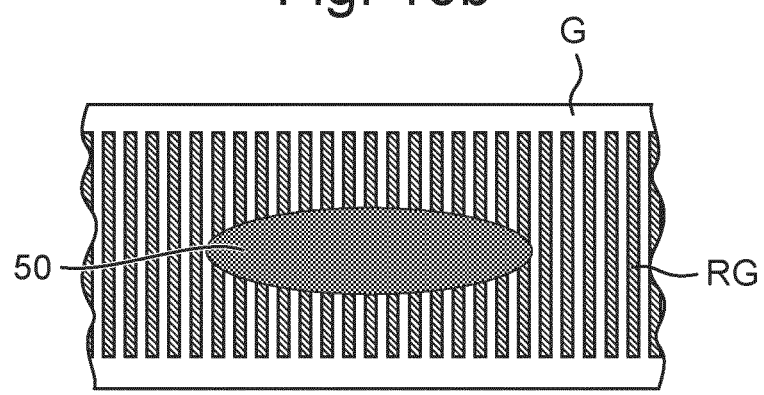

In an embodiment, the measurement device may be positioned on a reference frame RF, or any element facing the substrate W/substrate support WT as in some of the above described configurations. FIGS. 10a and 10b show a measurement device that uses measurement beam 50 in combination with the grid G (as described above). The grid G may be positioned on the substrate support WT. As in the above embodiments, the radiation output 20 may provide the measurement beam 50. In this embodiment, the radiation output 20 may emit the measurement beam 50 in a direction angled at 45 degrees with respect to the Y-axis and Z-axis. Optionally, the measurement device may comprise a lens 70 that is placed along the optical axis of the measurement beam 50 emitted from the radiation output 20.

The measurement device may optionally comprise any combination of a polarization beam splitter 71 (whose separation plane is parallel to an XZ plane), reflection mirrors 72 and 73, lenses 74 and 75, quarter wavelength plates (i.e. λ/4 plate) 76 and 77, refection mirrors 78 and 79, and the like. In this case, reflection mirror 73 may be placed at a position symmetric to reflection mirror 72, with a separation plane of polarization beam splitter 71 as a reference. Similarly, converging lens 74 and 75, λ/4 plates 76 and 77, and reflection mirrors 78 and 79 may also be placed at positions symmetric to each other, with the separation plane of polarization beam splitter 71 as a reference. The measurement system may include a polarizer (an analyzer), a sensor 40 (such as a photodetector), and the like. The sensor 40 may be placed on a return optical path of the reflection diffraction radiation of the measurement beam 50 via the separation plane of polarization beam splitter 71.

In the measurement device, the radiation output 20 may emit the measurement beam 50 which may be incident on polarization beam splitter 71, optionally via lens 70. The measurement beam 50 may be split by polarization into two beams 50C and 50D. In this case, a P-polarization component of the measurement beam 50 may be transmitted through the polarization beam splitter 71 and thus, may form measurement beam 50C. Furthermore, an S-polarization component of the measurement beam 50 may be reflected off the separation plane of the polarization beam splitter 71 and may form measurement beam 50D. The measurement beams 50C and 50D (which are components of the measurement beam 50) may be reflected by reflection mirrors 72 and 73 respectively, and are incident on grid G, which in this case may comprise a reflective grating RG as shown in FIG. 10b.

The measurement device as described herein may function as described in further detail in PCT patent application publication no. WO 2009-014252A1, which is incorporated herein in its entirety by reference.

Figure 11:
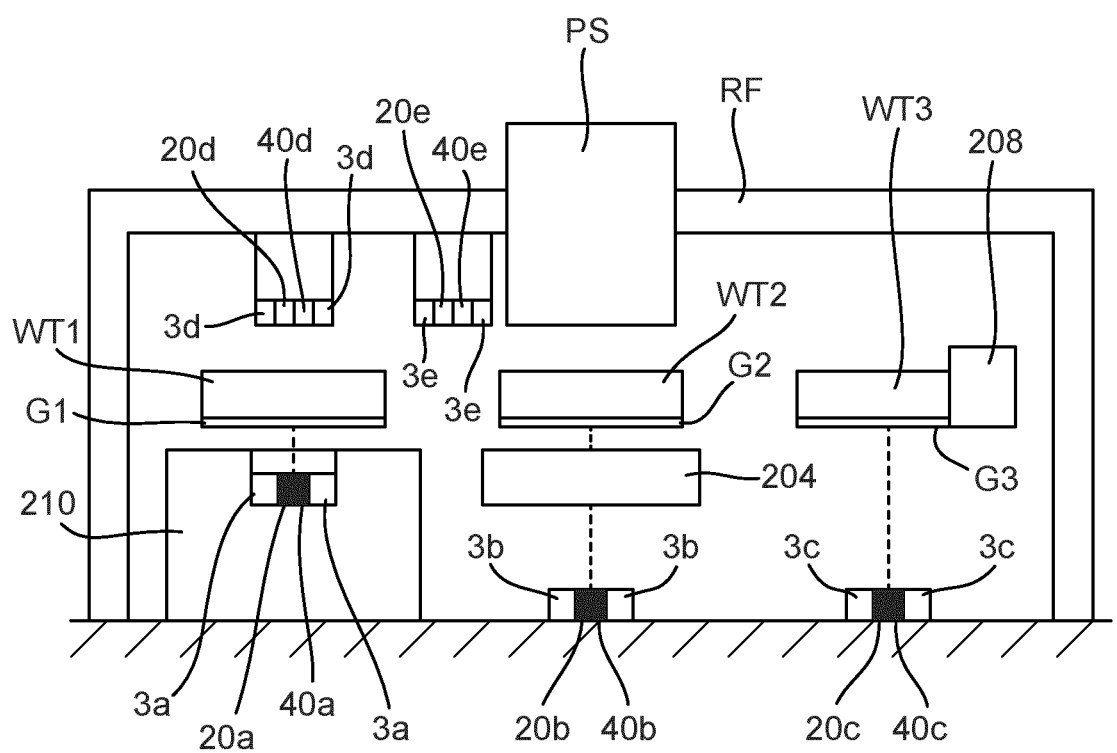
FIG. 11 is a cross-sectional view of a system.

In an embodiment, at least one of the systems as shown in FIG. 11 may be provided. As further depicted in FIG. 11, an exposure device, e.g., projection system PS, may be provided in combination with at least one system as described in any of the above embodiments. The projection system PS may be as described above. The systems used as described below may be in any position of configuration as described in United States patent application publication no. US 2019-377270, which is hereby incorporated in its entirety by reference, and particularly in relation to FIG. 9 of US 2019-377270.

The system may comprise a measurement device with a first radiation output 20a and a first sensor 40a, and a first fluid supply device 3a. The system may comprise a measurement device with a second radiation output 20b and a second sensor 40b, and a second fluid supply device 3b. The system may comprise a measurement device with a third radiation output 20c and a third sensor 40c, and a third fluid supply device 3c. The system may comprise a measurement device with a fourth radiation output 20d and a fourth sensor 40d, and a fourth fluid supply device 3d. The system may comprise a measurement device with a fifth radiation output 20e and a fifth sensor 40e, and a fifth fluid supply device 3e.

Multiple systems may be provided as shown in FIG. 11. Any, some, or all of the systems shown in FIG. 11 may be provided.

As shown in FIG. 11, the exposure device, e.g., projection system PS, is supported by a reference frame RF. In an embodiment, the exposure device is movable relative to the reference frame RF.

In an embodiment, the system comprising the first radiation output 20a, first sensor 40a and first fluid supply device 3a is provided with a first grid G1. Stationary support 210 comprises a recess for holding the first radiation output 20a, first sensor 40a and first fluid supply device 3a. The first grid G1 is arranged at a bottom surface of a first substrate support WT1 configured to support a substrate (omitted in the Figure for the sake of simplicity). The first radiation output 20a and first sensor 40a face the first grid G1 while the first substrate support WT1 is near or at the fourth radiation output 20d and fourth sensor 40d (described further below) and are arranged to provide (or generate) a first signal representative of positional information of the first substrate support WT1. The first radiation output 20a and first sensor 40a may be an encoder head system comprising multiple encoder heads and/or comprising one or more other position sensors than encoder heads, for example one or more capacitive or interferometric sensors.

The first radiation output 20a and first sensor 40a may be coupled to the stationary support 210, for example, via a dynamical isolator as described in U.S. patent application publication no. US 2019-377270, which is incorporated herein in its entirety by reference. A position of the first radiation output 20a and first sensor 40a may be maintained relative to a reference. The reference may be the fourth radiation output 20d and fourth sensor 40d or the projection system PS.

In an embodiment, the system comprising the second radiation output 20b, the second sensor 40b and the second fluid supply device 3b is provided with a second grid G2. The second grid G2 is arranged at a bottom surface of a second substrate support WT2 configured to support a substrate (omitted in the Figure for the sake of simplicity). The second radiation output 20b and second sensor 40b are arranged to face the second grid G2 so as to provide (or generate) a second signal representative of positional information of the second substrate support WT2. The second radiation output 20b and second sensor 40b face the second grid G2 while the second substrate support WT2 is near or at the projection system PS, and are arranged to provide (or generate) a second signal representative of positional information of the second substrate support WT2. The second radiation output 20b and second sensor 40b may be an encoder head system comprising multiple encoder heads and/or comprising one or more other position sensors than encoder heads, for example one or more capacitive or interferometric sensors.

The second radiation output 20b and second sensor 40b may be mounted on a measurement arm, such as L-shaped bar LRF described above (referring to FIG. 9). The measurement arm may be attached to the reference frame RF and may extend below the second substrate support WT2. The second radiation output 20b and second sensor 40b may be located along an optical axis O of the projection system PS.

The second substrate support WT2 and the first substrate support WT1 may exchange position such that the first radiation output 20a and first sensor 40a face the second grid G2 and such that the second radiation output 20b and second sensor 40b face the first grid G1. In that situation, the first radiation output 20a and first sensor 40a may provide (or generate) the first signal that is representative of positional information of the second substrate support WT2. In that situation, the second radiation output 20b and second sensor

40*b* may provide (or generate) the second signal that is representative of positional information of the first substrate support WT1.

In an embodiment, the system comprising the third radiation output 20*c*, the third sensor 40*c* and third fluid supply device 3*c* is provided with a third grid G3. The third grid G3 is arranged at a bottom surface of a third substrate support WT3 configured to support a substrate (omitted in the Figure for the sake of simplicity). The third radiation output 20*c* and third sensor 40*c* are arranged to face the third grid G3 so as to provide (or generate) a third signal representative of positional information of the third substrate support WT3. The third radiation output 20*c* and third sensor 40*c* face the third grid G3 while the third substrate support WT3 is supported by an exchange mechanism 208, and is arranged to provide the third signal representative of positional information of the third substrate support WT3.

The exchange mechanism 208 may provide the third substrate support WT3 to a mover 204 and may remove the third substrate support WT3 from the mover 204. The mover 204 is arranged to support the second substrate support WT2 while near the exposure device. The mover may be arranged to support any of the first substrate support WT1, the second substrate support WT2 and the third substrate support WT3.

The third radiation output 20*c* and third sensor 40*c* may be an encoder head system comprising multiple encoder heads and/or comprising one or more other position sensors than encoder heads, for example one or more capacitive or interferometric sensors.

The third radiation output 20*c* and third sensor 40*c* may be mounted on a further measurement arm, such as L-shaped bar LRF described above (referring to FIG. 9). The further measurement arm may be attached to the reference frame RF and may extend below the third substrate support WT3.

The third substrate support WT3 may take the position of the second substrate support WT2 such that the second radiation output 20*b* and second sensor 40*b* faces the third grid G3. In that situation, the second radiation output 20*b* and second sensor 40*b* may provide (or generate) the second signal that is representative of positional information of the third substrate support WT3.

In an embodiment, the system comprising the fourth radiation output 20*d*, the fourth sensor 40*d* and the fourth fluid supply device 3*d* is provided. The fourth radiation output 20*d* and the fourth sensor 40*d* are used to provide measurement information of a substrate (i.e., arranged to measure the substrate). The projection system PS and the fourth radiation output 20*d* and fourth sensor 40*d* are distant to each other. The fourth radiation output 20*d* and fourth sensor 40*d* may be any suitable device arranged to provide measurement information of a substrate (i.e., arranged to measure the substrate).

In an embodiment, the system comprising the fifth radiation output 20*e*, fifth sensor 40*e* and fifth fluid supply device 3*e* is provided. The fifth radiation output 20*e* and fifth sensor 40*e* are arranged to provide further measurement information of a substrate (i.e., arranged to perform a further measurement of the substrate).

The fifth radiation output 20*e* and fifth sensor 40*e* are closer to the projection system PS than the fourth radiation output 20*d* and fourth sensor 40*d*. The fourth radiation output 20*d* and fourth sensor 40*d* are further away from the projection system PS than the fifth radiation output 20*e* and fifth sensor 40*e*. The fifth radiation output 20*e* and fifth sensor 40*e* may be similar to the fourth radiation output 20*d* and fourth sensor 40*d* and may provide similar information about a substrate. For example, the fifth radiation output 20*e* and fifth sensor 40*e* may be the same type of measurement device as the fourth radiation output 20*d* and fourth sensor 40*d*, but the fourth radiation output 20*d* and fourth sensor 40*d* may provide information about the substrate at a better accuracy than the fifth radiation output 20*e* and fifth sensor 40*e* by taking a longer measurement time; in other words, the fifth radiation output 20*e* and fifth sensor 40*e* may take less measurement time to complete a measurement of the substrate. The fifth radiation output 20*e* and fifth sensor 40*e* may perform a measurement of the substrate while the second substrate support WT2 is supported by the mover 204.

Information provided by the fifth radiation output 20*e* and fifth sensor 40*e* may be used to determine the z-position of the surface of a substrate relative to an image plane of the exposure device. The fifth radiation output 20*e* and fifth sensor 40*e* may comprise a levelling sensor system that provides information about a height profile of the substrate, e.g., flatness of the substrate. A levelling sensor system may also be referred to as an auto-focus system. Information about the height profile of the substrate may be used to determine a positional relationship between the substrate and the patterning device MA as described in United States patent application publication no. US 2019-377270, hereby incorporated in its entirety by reference.

Information of the fifth radiation output 20*e* and fifth sensor 40*e* may be used to determine the x- and y-position of the substrate relative to an image of a reference mark of a patterning device MA, for example one or more of the patterning device alignment marks M1, M2. Additionally or alternatively, the fifth radiation output 20*e* and fifth sensor 40*e* may provide information about the position of one or more substrate alignment marks P1, P2 on a substrate; in other words, the fifth radiation output 20*e* and fifth sensor 40*e* may measure the position of one or more substrate alignment marks P1, P2 on the substrate. The information about the position of one or more substrate alignment marks P1, P2 may be used to determine the position of the one or more substrate alignment marks P1, P2 relative to each other or to compare the information with reference information. The fifth radiation output 20*e* and fifth sensor 40*e* may be part of a substrate alignment sensor system that provides information about in-plane deformation of the substrate. The fifth radiation output 20*e* and fifth sensor 40*e* may comprise multiple alignment sensors as disclosed in United States patent application publication no. US 2009-233234, hereby incorporated in its entirety by reference. In other words, the substrate alignment sensor system may comprise such multiple alignment sensors. Alternatively, the substrate alignment sensor system may comprise a single alignment sensor. The information about in-plane deformation may be used to position the substrate to a certain x- and y-position during exposure of a certain target portion C, to create an image at a correct x- and y-position on the substrate as described in United States patent application publication no. US 2019-377270, hereby incorporated in its entirety by reference.

In the embodiments shown in FIG. 11, it will be noted that the fluid supply devices are all shown in a position which would provide fluid as a fluid stream surrounding a beam as described in relation to FIGS. 2 and 3. However, any of the systems shown in FIG. 11 may be provided with the fluid supply device being configured to provide fluid in any appropriate way, e.g. to provide fluid as a fluid stream to the beam (rather than surrounding the beam). Thus, any, some or all of the systems as shown in FIG. 11 may be adapted to vary the position of the fluid supply device relative to the respective radiation output and sensor, for example as shown and described in relation to FIG. 5.

In any of the above embodiments, the measurement device may or may not comprise a radiation source. For example, an external source of radiation might be used. For example, at least a part of the projection beam may be redirected to the sensor. Thus, any description relating to the measurement device may include a sensor without a radiation source, and any radiation source might be replaced with an external radiation source which is not part of the measurement device to provide the measurement beam 50.

Figure 12:
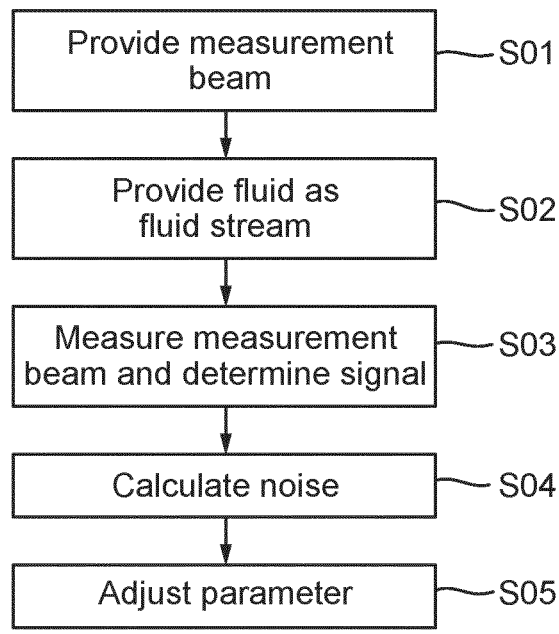
FIG. 12 shows method related steps in a flowchart.

An embodiment of the present invention includes a method of reducing noise of a system for measuring a measurement beam 50. The system may be the system of an embodiment of the invention as described in relation to any of the above described embodiments or variations. Thus, the system for measuring the measurement beam 30 can be configured to carry out the method as described below and as shown in FIG. 12.

The method comprises providing the measurement beam 50 (step S01), providing fluid as a fluid stream (step S02) to, or surrounding, the measurement beam 50, measuring the measurement beam 50 and determining a signal (step S03) based on the measured measurement beam 50. The method further comprises calculating noise of the signal which is based on the measured beam 50 (step S04). The method further comprises adjusting a parameter of the fluid to reduce the calculated noise (step S05). At least one parameter may be adjusted, e.g. multiple parameters may be adjusted, although the method may be effective when only adjusting a single parameter. As described above, it is beneficial to reduce the noise, as this correlates with a reduction in errors relating to, for example, variation in the refractive index of the medium through which the measurement beam 50 passes.

The method relies on adjusting a parameter based on the calculated noise. Thus, to effectively reduce the noise, the effect of parameter adjustment on the noise should be known. Most generally, the method comprises obtaining information indicating a relationship between the parameter and the noise. The relationship between the parameter and the noise may be known from previous tests or data. Thus, the system may include a memory storage, e.g. in communication with the controller 100, which stores data of the relationship between the parameter and the noise. The method may include obtaining the relevant data, e.g. receiving the data from an external source. Alternatively, the method may include determining the relationship between the parameter and the calculated noise.

Figure 13:
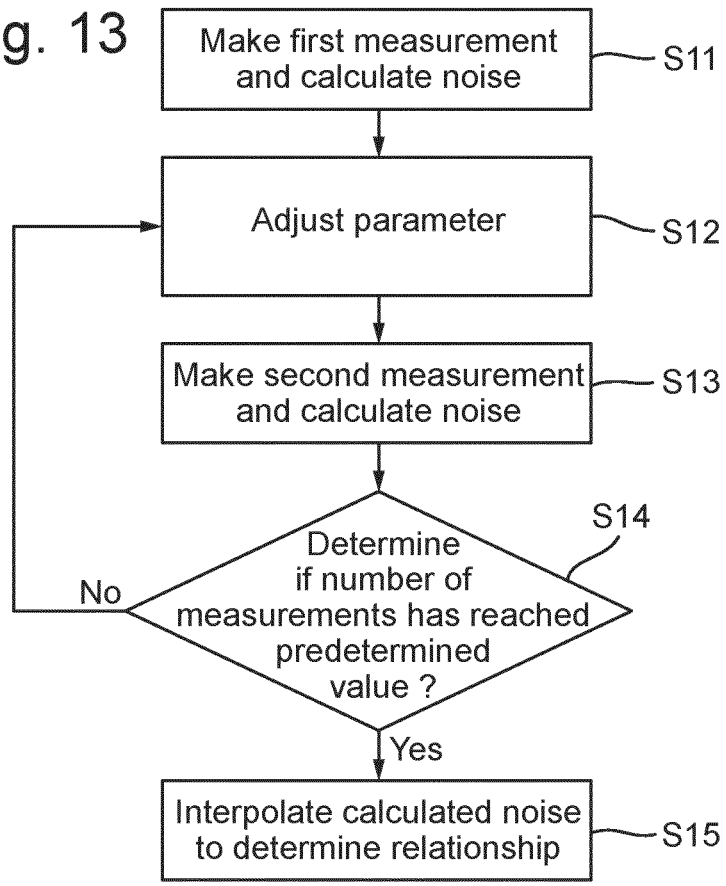
FIG. 13 shows method related steps in a flowchart.

The method may be configured to determine the relationship, as described below and as shown in FIG. 13. If the method includes determining the relationship, this can include making a first measurement of the measurement beam 50 and calculating noise of a corresponding signal (step S11). When the first measurement is taken, the parameter is at a known value, i.e. a first value. This provides a first link between the noise of the signal and the parameter of the fluid, i.e. when the parameter is at the first value. To determine how the calculated noise varies with the parameter, further measurements are taken. The method may thus include adjusting the parameter (step S12) of the fluid to a value which is different from the first value, making a second measurement of the measurement beam 50 and calculating noise of a corresponding signal (step S13). When the second measurement is taken, the parameter is at a known value, i.e. a second value. This provides a second link between the noise of the signal and the parameter of the fluid, i.e. when the parameter is at the second value. This may be continued until an appropriate number of measurements is carried out. The minimum number of measurements carried out may be two. However, this is desirably higher because the higher the number of measurements, the more accurately the relationship can be determined, which desirably means that the more accurately the optimal set point can be determined.

After each measurement, the method will include a step of determining if a number of measurements taken reaches a predetermined value (step S14). If it is determined that the number of measurements has not reached the predetermined value (S14=No), then the relevant steps are repeated. Specifically, if the predetermined value has not been reached, then the method includes a further step of adjusting the parameter (step S12), measuring the measurement beam 50 and calculating noise of a corresponding signal (step S13), and further to this, determining if the number of measurements taken reaches the predetermined value (step S14). This will be repeated until the number of measurements taken reaches the predetermined value (step S14=Yes). The predetermined value may be based on how many data points are needed to determine the relationship between the parameter and the noise. To a certain extent, the greater the number of measurements taken, the more accurately the relationship can be determined. However, after a certain amount of relevant data has been collected, then additional measurements do not greatly improve the accuracy of the relationship. Thus, the predetermined value will be a balance of the number of measurements needed to determine the relationship while avoiding carrying out measurements which are of less use.

If/when it is determined that the number of measurements is equal to (or greater than) the predetermined value (step S14=Yes), the method includes interpolating the calculated noise at the parameters at which the measurement beam 50 has been measured to determine the relationship between the parameter and the calculated noise (step S15). For example, if the data points are considered on a graph, then the interpolation may include providing a line of best fit. Any known technique could be used to interpolate the data points to provide an estimated relationship between the parameter and the noise.

The method may include determining one or more optimal settings for the parameter based on the relationship between the parameter and the calculated noise. The one or more optimal settings for a given parameter may correspond to substantially minimal noise. For example, the method may include determining the value of a given parameter at which the relationship between the given parameter and the noise indicates that the noise is at a minimum. This may be determined in any appropriate way, for example, by determining the lowest value of noise indicated by the relationship, and from this, determining the predicted value of the parameter when this lowest value of noise occurs. The method may include adjusting the parameter to have the optimal value, i.e. at which the noise is substantially at its minimum for the variation of that parameter. Of course, the method may include adjusting one or more various parameters based on one or more optimal values for each parameter.

Desirably, the steps of the methods described above are carried out in the order described herein.

The system can be configured to function during, or subsequent to, an existing thermal calibration setup. This is advantageous because this reduces any penalty to setup time or availability. In a lithography apparatus, calibration of modules in the apparatus can be carried out through temperature modulation in the system during a process of testing substrate support thermal optimization. In an embodiment, instead of measuring the temperature of the surrounding environment separately, it is possible to obtain the refractive index error output during the substrate support optimization test and find the thermally optimized state from the refractive index error reading, i.e. from the calculated noise. One or more various parameters of the fluid (e.g. the purging gas) can be adjusted to reduce the noise, or desirably, to minimize the noise. For example, the temperature and/or humidity might be adjusted to reduce, or desirably minimize, calculated noise.

By combining the thermal calibration and carrying out measurements related to reducing the noise, it might be possible to save hardware design effort, cost and production time availability. For example, a substrate support WT optimization test, may modulate through different temperatures of conditioning liquid until it achieves the best temperature for the substrate support WT and the system that provides the immersion liquid in an immersion lithographic apparatus. The change in the temperature of this conditioning liquid will indirectly affect the temperature of the fluid of the fluid stream. Every time this will happen, the measurement device can measure the measurement beam 50, determine a signal and calculate noise of the signal (which corresponds to the refractive index error). At the end of this new test, on top of the matched information obtained from a substrate support WT matching test, an output of the noise (which represents the refractive index error) versus different fluid temperatures will be obtained. An optimized thermal point can be obtained from this (which corresponds to the lowest noise) and adjusted accordingly through the one or more parameter settings of the fluid, such as temperature and/or humidity.

In the above described embodiments, the term "measurement beam" refers to a beam which can be measured using the system. In most of the examples, the measurement beam is a beam emitted from an output of the measurement device, e.g. the radiation output 20. Alternatively or additionally, the measurement beam may be a projection beam, i.e. the beam may be at least part of the beam from the projection system PS. For example, the beam may be radiation beam B described above. Thus, the system may be used for measuring the projection beam.

As will be understood from the embodiments described above, the system as described in relation to any of the Figures and having any of the variations described above, may be part of a lithographic apparatus. Such a lithographic apparatus can be used in a device manufacturing method to irradiate a substrate W using a projection radiation beam, such as radiation beam B.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications, and where the context allows, is not limited to optical lithography. For example, the present invention may be used in imprint lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

As will be appreciated by one of ordinary skill in the art, the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out one or more operations for aspects of the present application may be written in any combination of one or more programming languages. The program code may execute entirely on a user's computer, partly on a user's computer, as a stand-alone software package, partly on a user's computer and partly on a remote computer, or entirely on the remote computer or server. In the latter scenario, the remote computer may be connected to a user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A system comprising:
a measurement device configured to measure a beam and to determine a signal based on the measured beam; and
a fluid supply device configured to provide fluid as a fluid stream to, or surrounding, the beam,
wherein the system is configured to calculate noise of the signal, and to adjust, based on the calculated noise, a parameter of the fluid of the fluid stream.

2. The system of claim 1, wherein the parameter includes at least one selected from: temperature, pressure, humidity, fluid composition, and/or $CO_2$ content.

3. The system of claim 1, comprising at least four measurement devices and corresponding fluid supply devices, wherein the at least four measurement devices are configured to determine a position.

4. The system of claim 1, wherein the measurement device is configured to be positioned on:
a patterning device support configured to support a patterning device;
a patterning device reference system facing the patterning device support;
a substrate support configured to support a substrate; or
a reference system facing the substrate support.

5. The system of claim 1, wherein the beam is at least one selected from: a measurement beam, a light beam, an optical beam, a beam of radiation, or a projection beam.

6. A lithographic apparatus comprising the system of claim 1.

7. A method comprising:
providing fluid as a fluid stream to, or surrounding, a beam;
measuring the beam and determining a signal based on the measured beam;
calculating noise of the signal; and
adjusting, based on the calculated noise, a parameter of the fluid.

8. The method of claim 7, further comprising determining a relationship between the parameter and the calculated noise.

9. The method of claim 8, wherein the determining the relationship comprises:
i) making a measurement of the beam and calculating noise of a corresponding signal;
ii) adjusting a parameter of the fluid, making a further measurement of the beam and calculating noise of a corresponding signal;
iii) determining if a number of measurements taken reaches a predetermined value, wherein:
if it is determined that the number of measurements has not reached the predetermined value, repeating steps ii) and iii), and
if it is determined that the number of measurements is equal to or greater than the predetermined value, interpolating the calculated noise at values of the parameter at which the beam has been measured to determine the relationship between the parameter and the calculated noise.

10. The method of claim 8, further comprising determining one or more optimal settings for the parameter based on the relationship between the parameter and the calculated noise, wherein the one or more optimal settings correspond to substantially minimal noise.

11. The method of claim 7, wherein the parameter includes at least one selected from: temperature, pressure, humidity, fluid composition, and/or $CO_2$ content.

12. The method of claim 7, wherein the beam is at least one selected from: a measurement beam, a light beam, an optical beam, a beam of radiation, or a projection beam.

13. A non-transitory computer-readable medium comprising instructions therein, the instructions, upon execution by a computer system, configured to cause the computer system to at least:

obtain a signal based on a measured beam, wherein a fluid is or was provided as a fluid stream to, or surrounding, the beam;

calculate noise of the signal; and adjust, based on the calculated noise, a parameter of the fluid.

14. The medium of claim 13, wherein the instructions are further configured to cause the computer system to determine a relationship between the parameter and the calculated noise.

15. The medium of claim 14, wherein instructions configured to cause the computer system to determine the relationship are further configured to cause the computer system to:

i) obtain a signal based on a measurement of the beam and calculate noise of the signal;

ii) adjust a parameter of the fluid, obtain a signal based on a further measurement of the beam and calculate noise of the corresponding signal;

iii) determine if a number of measurements taken reaches a predetermined value, wherein:

if it is determined that the number of measurements has not reached the predetermined value, repeat ii) and iii), and if it is determined that the number of measurements is equal to or greater than the predetermined value, interpolate the calculated noise at values of the parameter at which the beam has been measured to determine the relationship between the parameter and the calculated noise.

16. The medium of claim 14, wherein the instructions are further configured to cause the computer system to determine one or more optimal settings for the parameter based on the relationship between the parameter and the calculated noise, wherein the one or more optimal settings correspond to substantially minimal noise.

17. The medium of claim 13, wherein the parameter includes at least one selected from: temperature, pressure, humidity, fluid composition, and/or $CO_2$ content.

18. The medium of claim 13, wherein the beam is at least one selected from: a measurement beam, a light beam, an optical beam, a beam of radiation, or a projection beam.

19. A lithographic apparatus comprising the medium of claim 13.

20. A measurement system comprising:

the medium of claim 13; and a measurement device configured to measure the beam.

* * * * *